US008946832B2

(12) United States Patent
Chen et al.

(10) Patent No.: US 8,946,832 B2
(45) Date of Patent: Feb. 3, 2015

(54) FILTER USING A WAVEGUIDE STRUCTURE

(75) Inventors: Chia-Chung Chen, Keelung (TW); Chewn-Pu Jou, Hsinchu (TW); Chin-Wei Kuo, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 709 days.

(21) Appl. No.: 12/701,170

(22) Filed: Feb. 5, 2010

(65) Prior Publication Data

US 2011/0193658 A1 Aug. 11, 2011

(51) Int. Cl.
*H01L 29/84* (2006.01)
*H01P 1/203* (2006.01)

(52) U.S. Cl.
CPC .................................. *H01P 1/20345* (2013.01)
USPC ........... 257/416; 257/508; 257/532; 257/533; 257/758; 257/E23.01

(58) Field of Classification Search
CPC ............ H01P 1/20345; H01L 23/5227; B81C 1/00246; B81C 2203/0735; B81B 2201/0271; B81B 2207/015; B81B 2207/012
USPC ............. 257/508, 758, 532, 533, E23.01, 416
See application file for complete search history.

(56) References Cited

U.S. PATENT DOCUMENTS

| | | | | |
|---|---|---|---|---|
| 5,990,766 | A | 11/1999 | Zhang et al. | |
| 6,621,134 | B1 * | 9/2003 | Zurn | 257/415 |
| 7,514,760 | B1 * | 4/2009 | Quevy | 257/416 |
| 7,863,071 | B1 * | 1/2011 | Ivanov et al. | 438/53 |
| 2004/0058591 | A1 * | 3/2004 | Avazi et al. | 439/894 |
| 2004/0201045 | A1 * | 10/2004 | Kurosawa et al. | 257/288 |
| 2006/0030115 | A1 * | 2/2006 | Chung | 438/381 |
| 2006/0289955 | A1 * | 12/2006 | Mitarai et al. | 257/415 |
| 2008/0160679 | A1 * | 7/2008 | Colgan et al. | 438/127 |
| 2009/0064785 | A1 * | 3/2009 | Fukuda et al. | 73/514.32 |

OTHER PUBLICATIONS

Shu, Y.H. et al., "Electronically Switchable and Tunable Coplanar Waveguide-Slotline Band-Pass Filters", IEEE Transactions on Microwave Theory and Techniques, 1991, 39(3):548-554.

Chen, C.C. et al., "High Performance Band-Pass Filter Embedded into SoCs Using VLSI Backend Interconnects and High Resistivity Silicon Substrate", IEEE Int'l. Interconnect Tech. Conf. Dig., Jun. 5-7, 2006, San Francisco, USA, pp. 295-298.

Entesari, K. et al., "A 12-18-GHz Three-Pole RF MEMS Tunable Filter", IEEE Transactions on Microwave Theory and Techniques, 2005, 53(8):2566-2571.

* cited by examiner

*Primary Examiner* — Anthony Ho
*Assistant Examiner* — David Chen
(74) *Attorney, Agent, or Firm* — Duane Morris LLP

(57) ABSTRACT

A representative filter comprises a silicon-on-insulator substrate having a top surface, a metal shielding positioned above the top surface of the silicon-on-insulator substrate, and a band-pass filter device positioned above the metal shielding. The band-pass filter device includes a first port, a second port, and a coupling metal positioned between the first and second ports.

12 Claims, 6 Drawing Sheets

FILTER USING A WAVEGUIDE STRUCTURE

TECHNICAL FIELD

The present invention relates to filters.

BACKGROUND

A high performance band-pass filter is typically embedded into a system-on-a-chip (SOC) using either a micro electro mechanical system (MEMS) or a printed circuit board (PCB) without a silicone substrate. Typically, a MEMS capacitor and/or a metal-air-metal capacitor is provided as an off-chip component and used to adjust the resonate frequency of the high performance band-pass filter. The PCB and MEMS devices are difficult to integrate with very-large-scale integration (VLSI) structures, including millimeter-wave devices and microelectronics devices.

Desirable in the art is an improved band-pass filter design.

SUMMARY

A representative filter comprises a silicon-on-insulator substrate having a top surface, a metal shielding positioned above the top surface of the silicon-on-insulator substrate, and a band-pass filter device positioned above the metal shielding. The band-pass filter device includes a first port, a second port, and a coupling metal positioned between the first and second ports.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
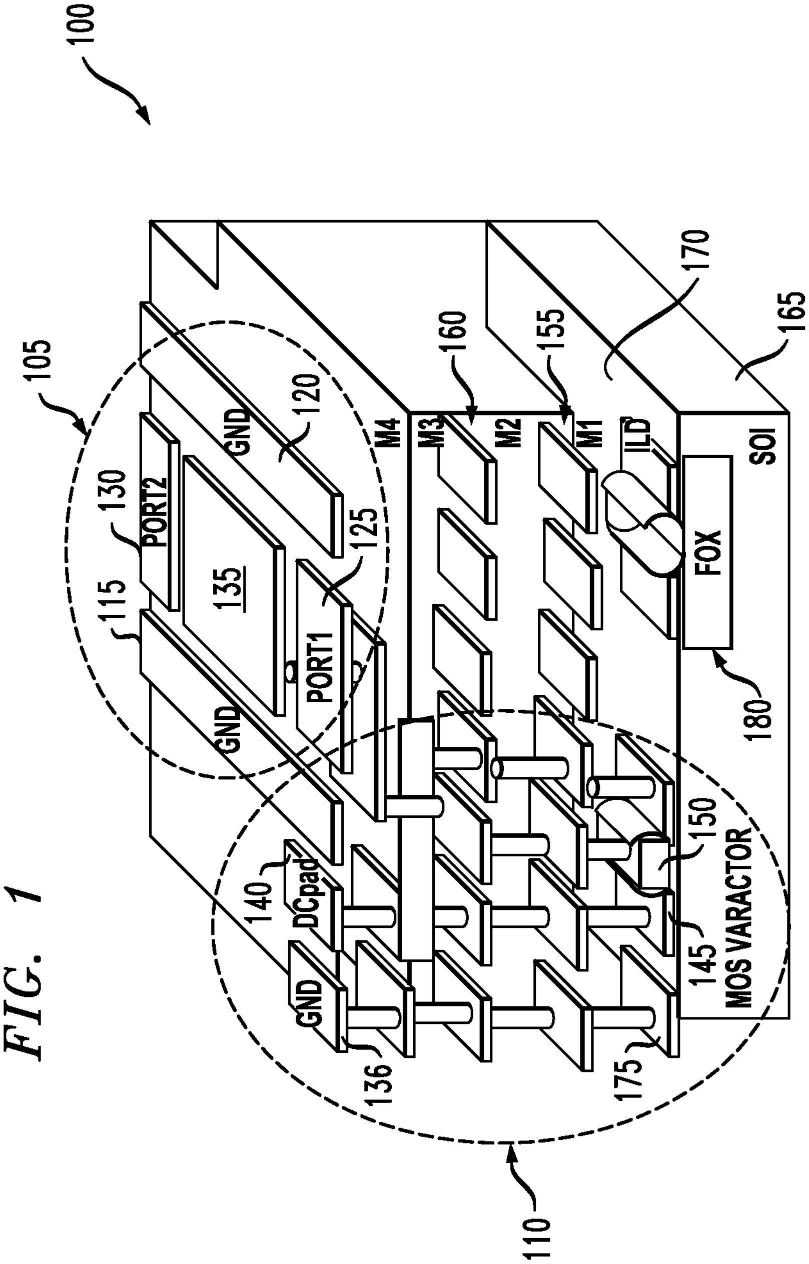
FIG. 1 is a view that illustrates a structure of a tunable band-pass filter in accordance with an embodiment of the disclosure.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning electrical communications and the like, such as, "coupled" and "electrically coupled" or "electrically connected," refer to a relationship wherein nodes communicate with one another either directly or indirectly through intervening structures, unless described otherwise.

FIG. 1 illustrates an embodiment of an integrated circuit tunable band-pass filter 100. The tunable band-pass filter 100 includes a metal-oxide-semiconductor (MOS) varactor 110 and a band-pass filter device 105, which, in this example, both are monolithically integrated together. The MOS varactor 110 is coupled to a top surface 170 of a silicon-on-insulator (SOI) substrate 165. At least one layer of metal shielding 155, 160 is positioned above the top surface 170 of the silicon-on-insulator substrate 165.

The band-pass filter device 105 is positioned above the metal shielding layers 155, 160. The band-pass filter device 105 includes a first port 125, a second port 130, and a coupling metal 135 positioned between the first and second ports 125, 130. The first port 125, the coupling metal 135, and the second port 130 of the band-pass filter device 105 are arranged on the same plane, atop the metal shielding layer 155, 160 and the SOI substrate 165, forming a coplanar waveguide (CPW). The metal shielding layers 155, 160 and/or the silicon-on-insulator substrate 165 improves coupling effects between the first port 125 and the coupling metal 135, and between the second port 130 and the coupling metal 135. The metal shielding layer 155, 160 can prevent AC signal of the coplanar waveguide structure 125, 130, 135 from passing below the coplanar waveguide structure 125, 130, 135 because the metal shielding layer 155, 160 can reduce direct coupling effect with the SOI substrate 165, and enhance port-to-port transmission. The band-pass filter further includes ground pads 115 and 120 between which the first port 125, the coupling metal 135, and the second port 130 are positioned.

The MOS varactor 110 includes a first ground pad 175, a first port 145, and a second port 150, all of which are coupled to the silicon-on-insulator substrate 165. The first ground pad 175 is implanted on the SOI substrate 165. The MOS varactor 110 further includes a second ground pad 136 and a direct current (DC) pad 140 positioned above the metal shielding layers 155, 160. The first ground pad 175, first port 145, and second port 150 of the MOS varactor 110 are coupled to the second ground pad 136, the DC pad 140 and the coupling metal 135 of the band-pass filter device 105, respectively, via a portion of the metal shielding layers 155, 160, metal line 220 (FIG. 2) and conductive vias there between. The MOS varactor 110 and the band-pass filter device 105 are further described in connection with FIG. 2.

It should be noted that the SOI substrate 165 further includes a transistor 180 that is formed as part of a standard MOS IC fabrication process. This process can produce a MOS varactor 300 (FIG. 3) with a band-pass filter device 105. The MOS varactor 300 is shown and later described in connection with FIG. 3.

Figure 2:
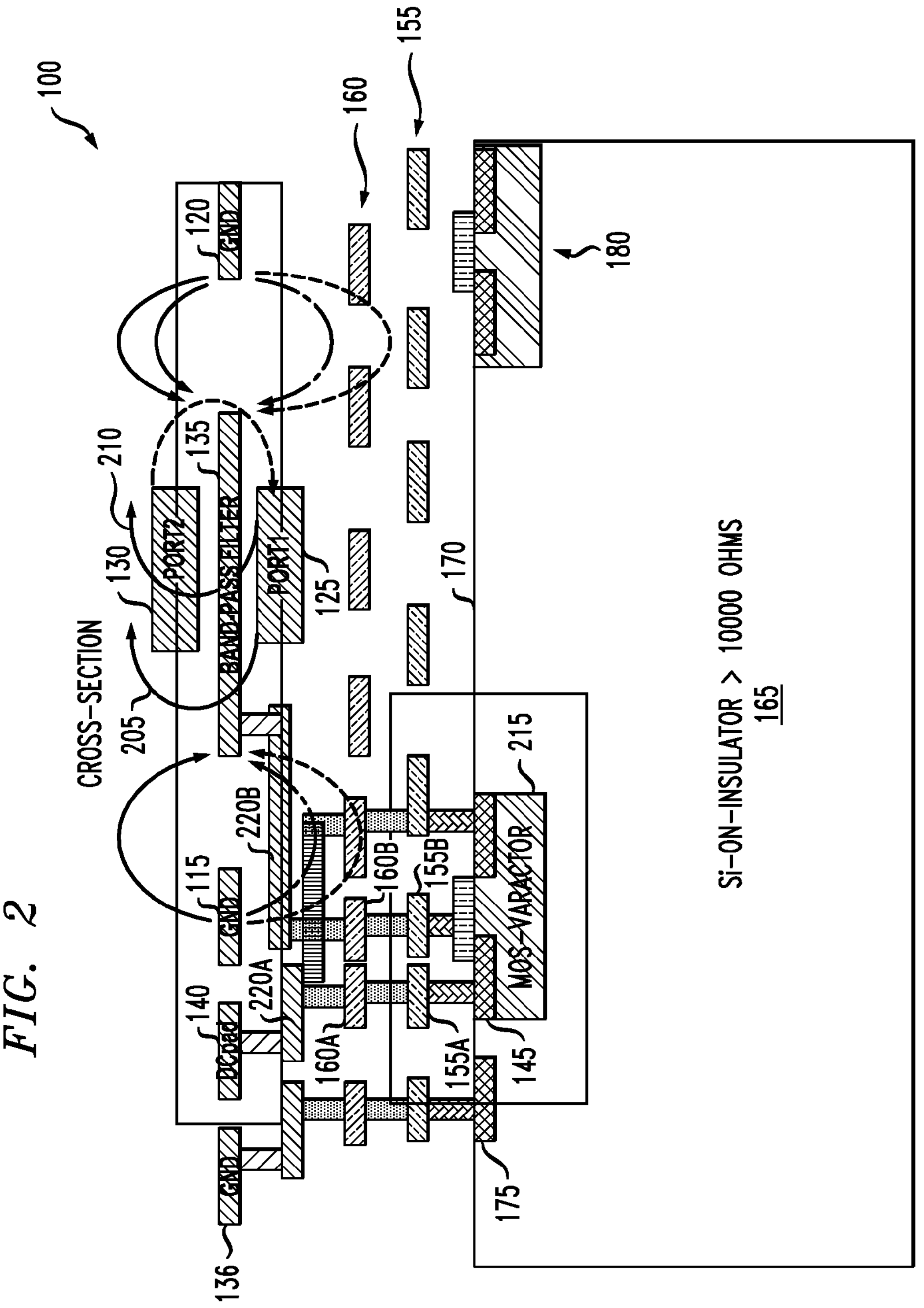
FIG. 2 is a cross-sectional view that illustrates a tunable band-pass filter in accordance with an embodiment of the disclosure.

FIG. 2 is a cross-sectional view of the integrated circuit tunable band-pass filter 100 of FIG. 1. First metal shielding layer 155 includes a set of spaced metal sections positioned above the top surface 170 of the silicon-on-insulator substrate 165, and the second metal shielding layer 160 includes a set of spaced metal sections positioned above the first metal shielding layer. The metal sections of the first metal shielding layer 155 are spaced apart from each other and each section extends lengthwise at least from the ground pad 115 to ground pad 120 of the band-pass filter device 105.

The metal sections of the second set 160 are positioned above and overlap the spaces between the metal sections of the first set 155. As shown in FIG. 2 the coupling effects 205, 210 between the first port 125 and the coupling metal 135 of the band-pass filter device 105, and between the coupling metal 135 and the second port 130 are improved due to the metal shielding layer 155, 160. The coplanar waveguide structure 125, 130, 135 can transfer the RF signal by coupling RF signal from the first port 125 to the second port 130. The RF signal from the first port 125 also couples between the coupling metal 135 and the ground pads 115, 120. The metal shielding layer 155, 160 and high resistive substrate 165 can cause weaker RF coupling (the dashed line) from passing below the metal shielding layer 155, 160 and enhance strong coupling above the coplanar waveguide structure 125, 130, 135 (the solid line) so that the RF filter characteristics can be shown.

In embodiments, the first port 145 of the MOS varactor 110 is a heavily doped-N implant region formed in an N-well section 215 of the SOI substrate 165 The second port 150 of the MOS varactor 110 can be formed from a polysilicon section or line formed on the SOI substrate 165. The first port 145 is coupled to the DC pad 140 by way of metal shielding section 155A, metal shielding section 160A and metal line 220A. The second port 150 is coupled to the coupling metal 135 of the band-pass filter device 105 by way of the metal shielding section 155B, the metal shielding section 160B, and the metal line 220B.

Advantageously, the structures shown in FIGS. 1 and 2 can be formed using conventional complementary metal-oxide-semiconductor (CMOS) processes and silicon-on-insulator (SOI) processing techniques. The metallization/interconnection layers formed over the substrate can be fabricated using copper (or dual copper) damascene processes with low-K inter-metal dielectrics (IMD) layers.

Figure 3:
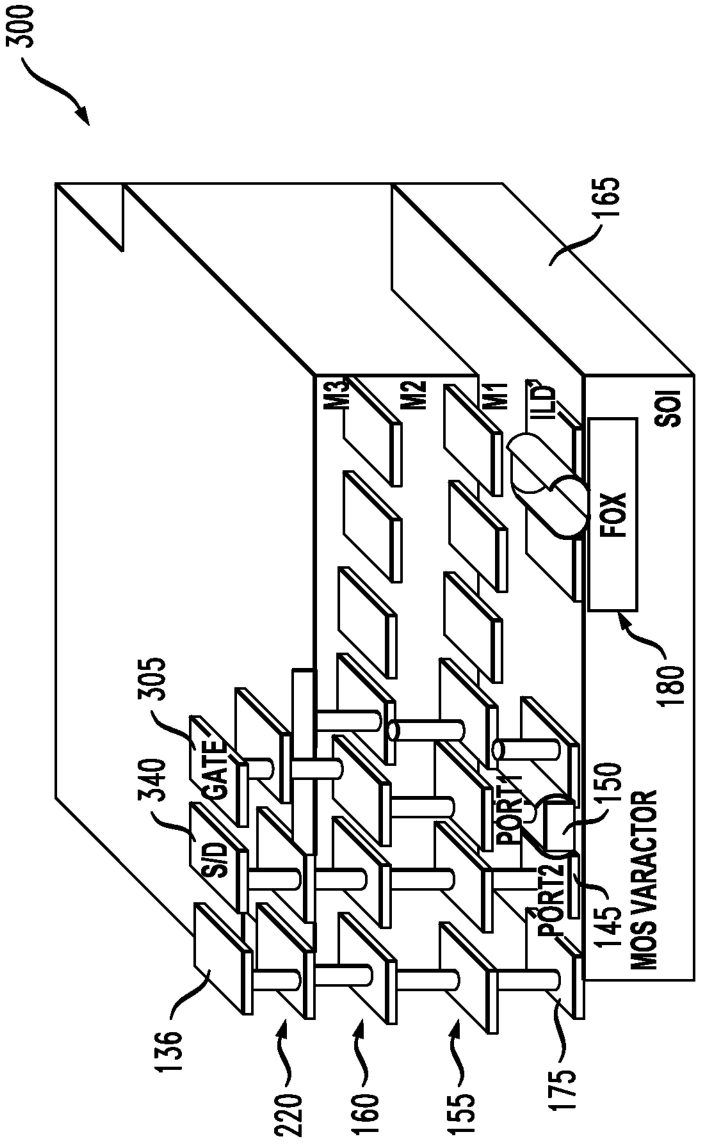
FIG. 3 is a view that illustrates a structure of a metal-oxide-semiconductor (MOS) varactor in accordance with an embodiment of the disclosure.
Figure 4:
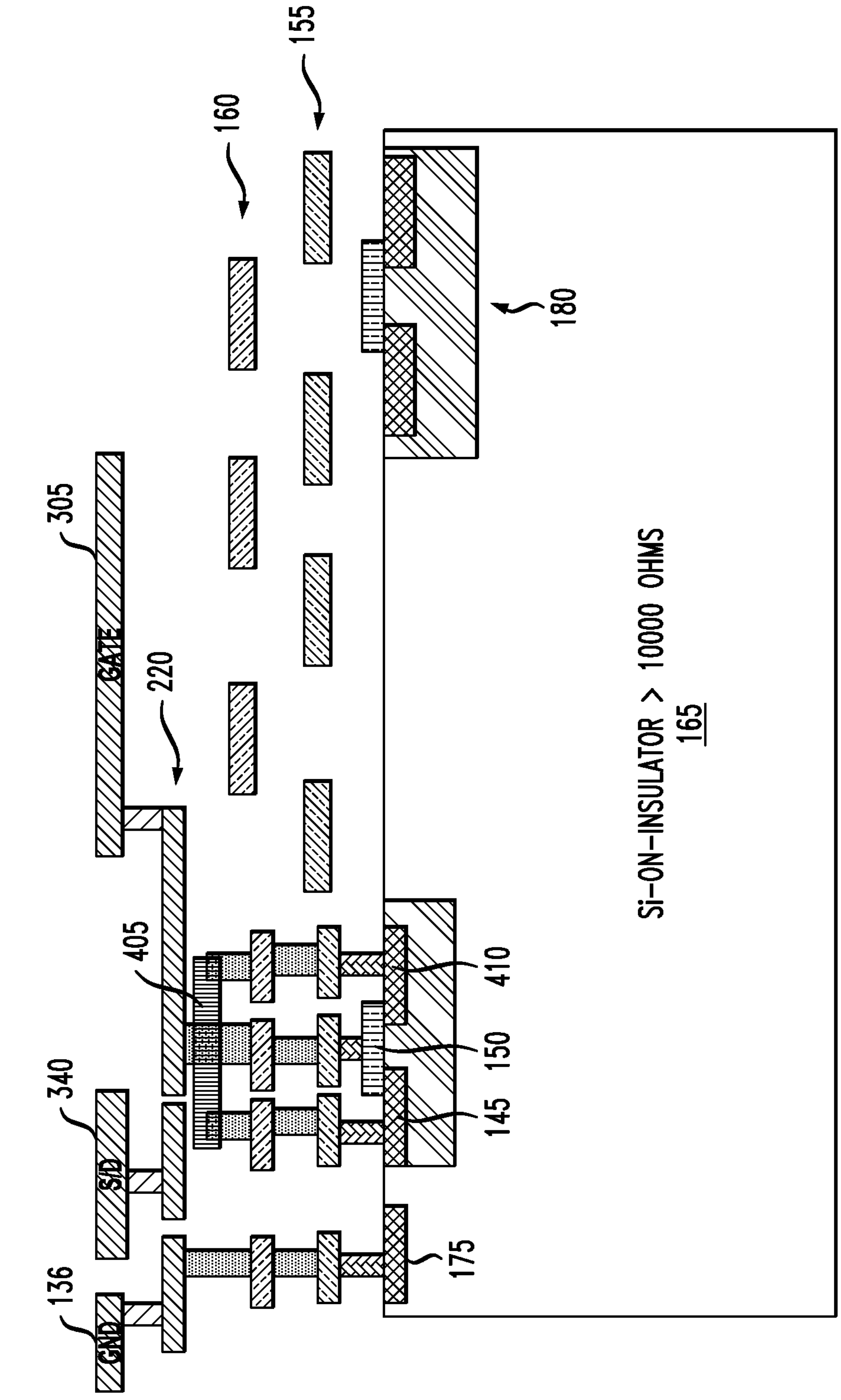
FIG. 4 is a cross-sectional view that illustrates a MOS varactor in accordance with an embodiment of the disclosure.

FIG. 3 illustrates an integrated circuit (IC) structure 300 having an alternative embodiment of a MOS varactor, and FIG. 4 is a cross-sectional view of the IC structure 300. The IC structure 300 is similar to the structure 100 of FIGS. 1 and 2 and like features are labeled with the same reference numbers, such as the metal shielding 155, 160, first and second ground pads 175, 136, first and second ports 145, 150 of the MOS varactor, and the silicon-on-insulator substrate 165. The DC pad 140 of the structure 100 is now labeled as a source/drain (S/D) pad 340 in structure 300. However, the IC structure 300 does not include a band-pass filter device 105 of FIG. 1. Rather, the structure 300 includes a gate pad 305. The first port 145 and second port 150 of the structure 300 are coupled to the S/D pad 340 and the gate pad 305, respectively, via a portion of the metal shielding 155, 160 and metal line 220. The gate pad 305 and the S/D pad 340 can be used as inter-finger type with, e.g, 10 um spacing. The S/D pad 340 is connected to a third port 410 via connection 405 becoming inter-finger type. The gate pad 305 and S/D pad 340 can have a tunable function embedded with CPW filter on VLSI technology to form the tunable band-pass filter. Alternatively or additionally, the gate pad 305 and S/D pad 340 can be connected to inductors and MOSFETs to form an LC tank VCO circuit.

Figure 5:
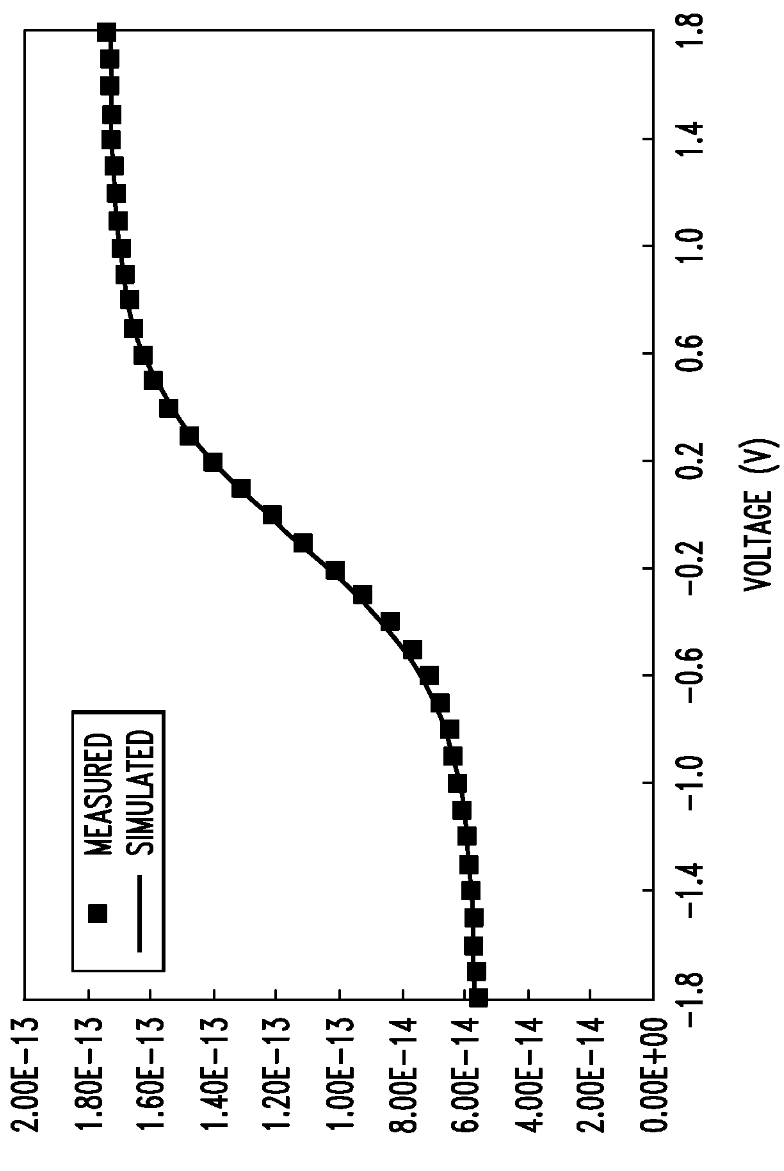
FIG. 5 is a capacitance-versus-voltage graph that illustrates capacitance of a MOS varactor at various voltages in accordance with an embodiment of the disclosure.

FIG. 5 is a capacitance-versus-voltage graph 500 illustrating capacitances of a MOS varactor formed in an IC structure 300 at various voltages in accordance with an embodiment of the disclosure. The MOS varactor changes capacitance values depending on the amount of voltage inputted at the S/D pad 340. In this particular graph the MOS varactor has a capacitance of approximately $6\times10^{-14}$° F. at −1.8 V and increases to approximately $1.8\times10^{-13}$° F. at 1.8 V. The graph 500 further shows that the measured capacitance values substantially trace the simulated capacitance values at a range of voltages.

Figure 6:
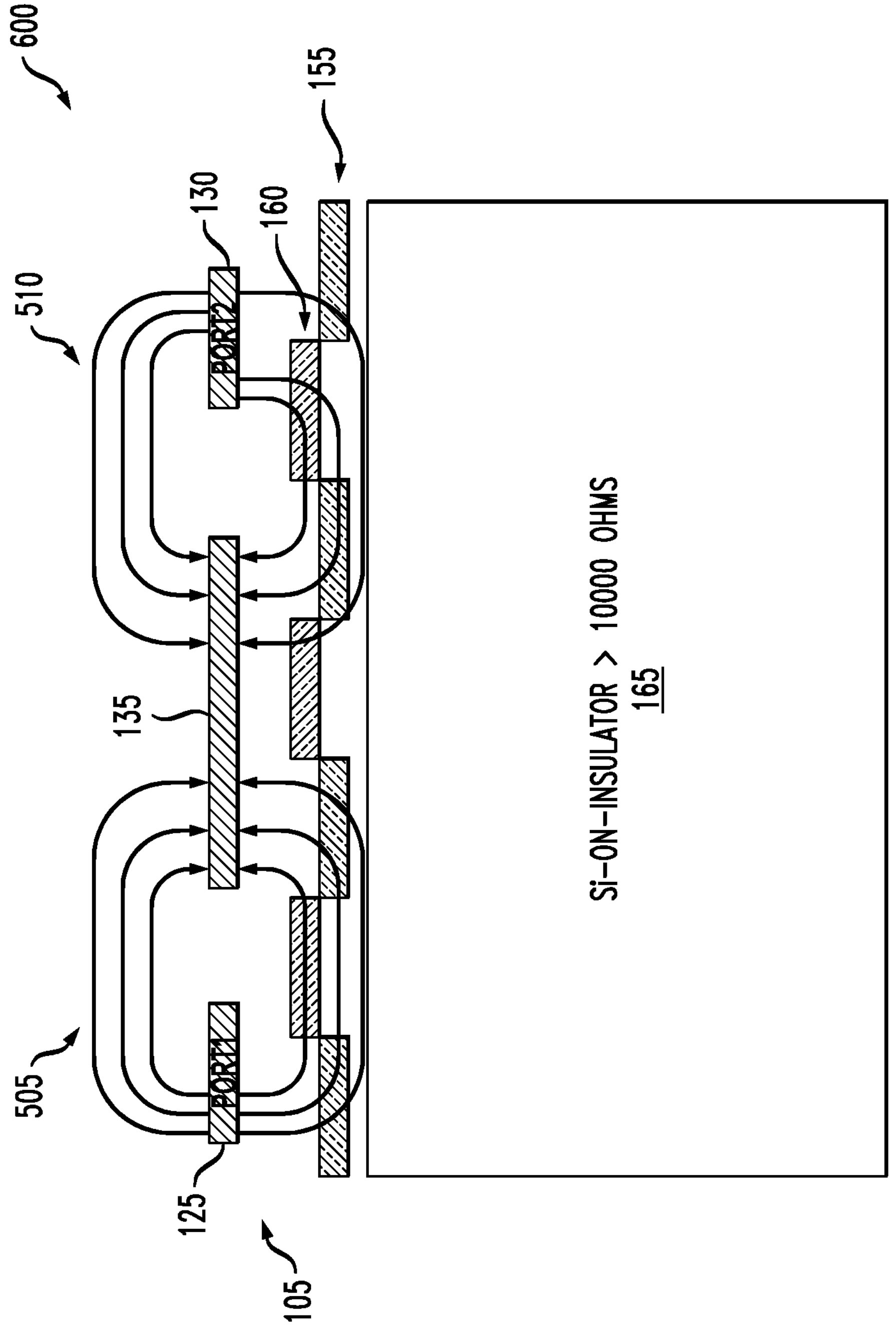
FIG. 6 is a cross-sectional view that illustrates a band-pass filter in accordance with an embodiment of the disclosure.

FIG. 6 is a cross-sectional view of a structure 600 that illustrates a band-pass filter in accordance with an embodiment of the disclosure. The difference between the structure 100 of FIG. 1 and the structure 600 is that the structure 600 does not include a MOS varactor 110; hence, the band-pass filter 600 is not tunable. In addition, the first set of metal sections 155 are positioned in a metal layer that is located directly below the metal layer in which the second set of metal sections 160 in structure 600 are positioned, and the metal shielding 155, 160 of the structure 600 is positioned in closer proximity to the top surface of the silicon-on-insulator substrate 165 than the metal shielding 155, 160 of the structure 100. The metal shielding 155, 160 can be approximately 0.6 um above the SOI substrate 165; whereas, the metal shielding 155, 160 in FIG. 1 is approximately 0.3 um above the SOI substrate 165. In this example, the band-pass filter device 105 improves its coupling effects 505, 510 not only by the metal shielding 155, 160 but also the silicon-on-insulator substrate 165.

As described herein, structures 100, 600 are presented incorporating at least one of the following: a MOS varactor 110, a band-pass filter device 105, and a metal shielding 155, 160. This approach allows for the use of a co-planar waveguide in structures 100, 600 to produce band-pass filter characteristic with the metal shielding 155, 160. In addition, the MOS varactor 110 can be embedded into the structure 100 allowing a resonate frequency of the band-pass filter to be tunable with higher tuning range and higher accuracy. The structure 100 reduces the physical area of a high performance tunable band-pass filter significantly compared to conventional high performance tunable band-pass filter. This approach has particular benefits for, for example, system-on-a-chip (SOC) and very-large-scale integration (VLSI) silicon-on-insulator (SOI) structures.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. An integrated circuit comprising:

a silicon-on-insulator substrate having a top surface;

a metal shielding positioned vertically above the top surface of the silicon-on-insulator substrate;

a band-pass filter device positioned vertically above the metal shielding, wherein the band-pass filter device includes a first port, a second port, and a coupling metal positioned on a common horizontal plane, the coupling metal being positioned between the first and second ports; and a metal-oxide-semiconductor (MOS) varactor including a first port formed in the silicon-on-insulator substrate and a second port formed on the silicon-on-insulator substrate, and a direct current (DC) pad disposed above the metal shielding such that the DC pad is coplanar with the coupling metal and is electrically coupled to the first port of the MOS varactor by way of the metal shielding, wherein the MOS varactor is electrically coupled to the band-pass filter by way of the metal shielding, and wherein the metal shielding is configured to reduce direct coupling between the band-pass filter device and the silicon-on-insulator substrate vertically over which the band-pass filter device is disposed.

2. The integrated circuit of claim 1, wherein the metal shielding includes a first metal shielding layer comprising a first set of metal sections and a second metal shielding layer comprising a second set of metal sections, wherein the first metal shielding layer is positioned above the top surface of the silicon-on-insulator substrate and the second metal shielding layer is positioned above the first metal shielding layer.

3. The integrated circuit of claim 2, wherein the metal sections of the first set are laterally spaced apart from each other and each section extends lengthwise at least from a ground pad to another ground pad of the band-pass filter device and the metal sections of the second set are positioned above the spaces between the metal sections of the first set.

4. The integrated circuit of claim 3, wherein the metal sections of the first and second sets are vertically spaced from one another and laterally misaligned so that the metal sections of the second set overlap the spaces between metal sections in first set.

5. The integrated circuit of claim 1, wherein the MOS varactor includes a first ground pad disposed in the silicon-on-insulator substrate.

6. The integrated circuit of claim 5, wherein the MOS varactor further includes a second ground pad positioned above the metal shielding, wherein the first ground pad and the second port of the MOS varactor are coupled to the second ground pad and the coupling metal of the band-pass filter device, respectively, at least in part through the metal shielding.

7. An integrated circuit comprising:

a silicon-on-insulator substrate having a top surface;

a metal shielding positioned vertically above the top surface of the silicon-on-insulator substrate;

a band-pass filter device positioned vertically above the metal shielding, wherein the band-pass filter device includes a first port, a second port, and a coupling metal positioned on a common horizontal plane, the coupling metal being positioned between the first and second ports; and a metal-oxide-semiconductor (MOS) varactor coupled to the silicon-on-insulator substrate and the band-pass filter device, wherein the MOS varactor and the band-pass filter are monolithically integrated together as the MOS varactor includes a first port is formed in the silicon-on-insulator substrate and a second port formed on the silicon-on-insulator substrate, and the MOS varactor including a direct current (DC) pad that is coplanar with the coupling metal and is electrically coupled to the first port of the MOS varactor by way of the metal shielding, and wherein the metal shielding is configured to reduce direct coupling between the band-pass filter device and the silicon-on-insulator substrate vertically over which the band-pass filter device is disposed.

8. The integrated circuit of claim 7, wherein the metal shielding includes a first metal shielding layer comprising a first set of metal sections and a second metal shielding layer comprising a second set of metal sections, wherein the first metal shielding layer is positioned above the top surface of the silicon-on-insulator substrate and the second metal shielding layer is positioned above the first metal shielding layer.

9. The integrated circuit of claim 8, wherein the metal sections of the first set are laterally spaced apart from each other and each section extends lengthwise at least from a ground pad to another ground pad of the band-pass filter device and the metal sections of the second set are positioned above the spaces between the metal sections of the first set.

10. The integrated circuit of claim 9, wherein the first set engages the second set.

11. The integrated circuit of claim 7, wherein the MOS varactor includes a first ground pad disposed in the silicon-on-insulator substrate.

12. The integrated circuit of claim 11, wherein the MOS varactor further includes a second ground pad positioned above the metal shielding, wherein the first ground pad and the second port of the MOS varactor are coupled to the second ground pad and the coupling metal of the band-pass filter device, respectively, at least in part through the metal shielding.

* * * * *

UNITED STATES PATENT AND TRADEMARK OFFICE

CERTIFICATE OF CORRECTION

PATENT NO. : 8,946,832 B2
APPLICATION NO. : 12/701170
DATED : February 3, 2015
INVENTOR(S) : Chia-Chung Chen et al.

It is certified that error appears in the above-identified patent and that said Letters Patent is hereby corrected as shown below:

In the Claims:

Claim 7, Column 6, Line 2 – delete "is formed" and insert -- formed --.

Signed and Sealed this
Thirteenth Day of October, 2015

Michelle K. Lee
*Director of the United States Patent and Trademark Office*